United States Patent
Farr et al.

(10) Patent No.: US 9,874,603 B2
(45) Date of Patent: Jan. 23, 2018

(54) SYSTEM AND METHOD FOR CAPACITIVE COUPLING TESTING

(71) Applicant: Avery Dennison Corporation, Mentor, OH (US)

(72) Inventors: Adrian N. Farr, Essex (GB); Ian James Forster, Essex (GB)

(73) Assignee: AVERY DENNISON RETAIL INFORMATION SERVICES, LLC, Mentor, OH (US)

(*) Notice: Subject to any disclaimer, the term of this patent is extended or adjusted under 35 U.S.C. 154(b) by 589 days.

(21) Appl. No.: 14/584,646

(22) Filed: Dec. 29, 2014

(65) Prior Publication Data

US 2016/0003895 A1 Jan. 7, 2016

Related U.S. Application Data

(60) Provisional application No. 62/021,449, filed on Jul. 7, 2014.

(51) Int. Cl.
*G01R 31/28* (2006.01)
*G01R 27/26* (2006.01)

(52) U.S. Cl.
CPC ..... *G01R 31/2884* (2013.01); *G01R 31/2822* (2013.01); *G01R 27/2605* (2013.01)

(58) Field of Classification Search
None
See application file for complete search history.

(56) References Cited

U.S. PATENT DOCUMENTS

| 7,301,458 B2* | 11/2007 | Carrender | G01R 31/2822 |
| | | | 235/438 |
| 2009/0138217 A1* | 5/2009 | Bufe | G01R 31/01 |
| | | | 702/58 |

* cited by examiner

*Primary Examiner* — Kristy A Haupt
(74) *Attorney, Agent, or Firm* — Avery Dennison Retail Information Services, LLC (57) ABSTRACT

A system for measuring RFID strap characteristics by coupling through a dielectric. The system can include a meter, test pads, springs, and wiring. Test pads may contact a substrate opposite of the RFID strap, and the coupling capacitance through the dielectric substrate may be utilized to calculate the strap capacitance. Similarly, other electrical properties of an RFID strap or other RFID assembly may be measured by coupling through a dielectric.

16 Claims, 10 Drawing Sheets

SYSTEM AND METHOD FOR CAPACITIVE COUPLING TESTING

CROSS-REFERENCE TO RELATED APPLICATION(S)

The present application claims priority from U.S. Provisional Application No. 62/021,449 filed Jul. 7, 2014, which is incorporated herein by reference in its entirety.

BACKGROUND

Radio frequency identification (RFID) labels and tags are a common tool for labeling, identifying, and tracking various goods and people. The goods so labeled involve a wide range of industries and include packages being shipped, cars, keys, livestock, identification badges, and merchandise in stores. RFID tags, either active or passive, are typically used with an RFID reader to read information from the RFID tag embedded in the label. For passive tags, a typical RFID reader/writer energizes transponder circuitry in the tag by transmitting a power signal. The power signal may convey data, which can be stored in a transponder memory, or the transponder circuitry may transmit a response signal containing data previously stored in its memory. If the transponder circuitry transmits a response signal, the RFID reader/writer receives the response signal and interprets the stored data. The data is then transmitted to a host computer for processing.

One current technique for manufacturing RFID chips for use in tags includes inserting the RFID chip into an RFID "strap" where the chip is connected to two oversized contact pads. This technique allows for greater mass production of RFID components, as the chip with oversized contacts can be inserted into circuitry, for example connected to an antenna, with much greater ease. The RFID straps are typically mounted on a substrate while being manufactured, and may be mounted on a substrate in use as well.

However, quality testing for physical characteristics such as the capacitance and/or resistance of the RFID strap can be a potential bottleneck in production and also a slow process when testing on any other substrate. Testing typically uses two contact pins, one for each contact pad. Examples of the slowing nature and problems of conventional testing are the movement of the pins up and down, the potential for dragging the pins across the surface and thereby damaging either the pin or the surface, and the need to pause testing for cleaning the pins whenever they become dirty or contaminated.

SUMMARY

According to at least one exemplary embodiment, a system for measuring RFID strap characteristics by coupling through a dielectric may be disclosed. The system can include a meter, test pads, springs or other material such as a foam or rubber, or web tension across a curved surface that helps maintain relatively constant contact pressure, and wiring. Test pads may contact a substrate opposite of the RFID strap, and the coupling capacitance through the dielectric substrate may be utilized to calculate the strap capacitance. Similarly, other electrical properties of an RFID strap or other RFID assembly may be measured by coupling through a dielectric.

BRIEF DESCRIPTION OF THE FIGURES

Advantages of embodiments of the present invention will be apparent from the following detailed description of the exemplary embodiments. The following detailed description should be considered in conjunction with the accompanying figures in which.

Exemplary

Exemplary

Exemplary

Exemplary

Exemplary

Exemplary

Exemplary

Exemplary

Exemplary

Exemplary

Exemplary

Exemplary

Exemplary

Exemplary

Exemplary

Exemplary

Exemplary

DETAILED DESCRIPTION

Aspects of the invention are disclosed in the following description and related drawings directed to specific embodiments of the invention. Alternate embodiments may be devised without departing from the spirit or the scope of the invention. Additionally, well-known elements of exemplary embodiments of the invention will not be described in detail or will be omitted so as not to obscure the relevant details of the invention. Further, to facilitate an understanding of the description discussion of several terms used herein follows.

As used herein, the word "exemplary" means "serving as an example, instance or illustration." The embodiments described herein are not limiting, but rather are exemplary only. It should be understood that the described embodiment are not necessarily to be construed as preferred or advantageous over other embodiments. Moreover, the terms "embodiments of the invention", "embodiments" or "invention" do not require that all embodiments of the invention include the discussed feature, advantage or mode of operation.

Further, many of the embodiments described herein are described in terms of sequences of actions to be performed by, for example, elements of a computing device. It should be recognized by those skilled in the art that the various sequences of actions described herein can be performed by specific circuits (e.g. application specific integrated circuits (ASICs)) and/or by program instructions executed by at least one processor. Additionally, the sequence of actions described herein can be embodied entirely within any form of computer-readable storage medium such that execution of the sequence of actions enables the at least one processor to perform the functionality described herein. Furthermore, the sequence of actions described herein can be embodied in a combination of hardware and software. Thus, the various aspects of the present invention may be embodied in a number of different forms, all of which have been contemplated to be within the scope of the claimed subject matter. In addition, for each of the embodiments described herein, the corresponding form of any such embodiment may be described herein as, for example, "a computer configured to" perform the described action.

According to at least one exemplary embodiment, a system for measuring RFID strap characteristics by coupling through a dielectric may be disclosed. The system can include a meter, test pads, springs, and wiring. Test pads may contact a substrate opposite of the RFID strap, and the coupling capacitance through the dielectric substrate may be utilized to calculate the strap capacitance. Similarly, other electrical properties of an RFID strap or other RFID assembly may be measured by coupling through a dielectric.

Figure 1A:
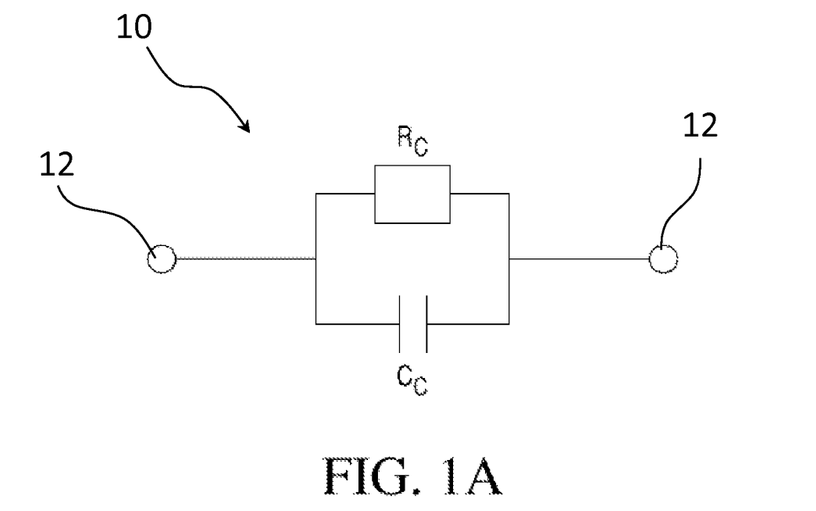
FIG. 1A shows a simplified diagram of an RFID chip.
Figure 1B:
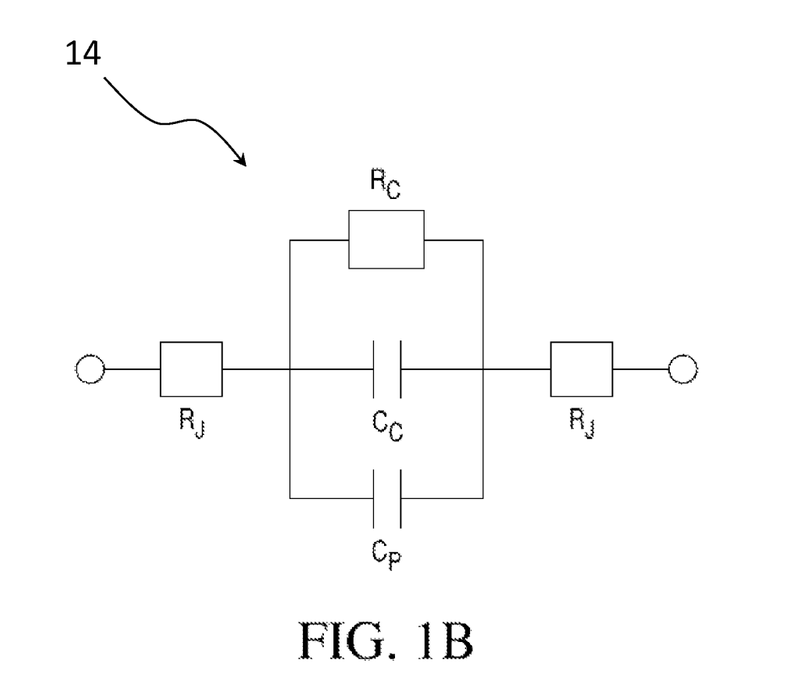
FIG. 1B shows a simple circuit diagram for a mounted RFID chip.

Referring to exemplary FIGS. 1A and 1B, an RFID chip 10 may include two connection points 12 and may have a chip resistance $R_C$ and a chip capacitance $C_C$. A mounted RFID chip 14 may further include joint resistance $R_J$ and a parasitic capacitance $C_P$. The chip resistance may be primarily dependent on the processing of the chip at the wafer level. The joint resistance, in a stable assembly process, may be negligible compared to the chip resistance, and can generally be assumed to be constant.

Figure 2A:
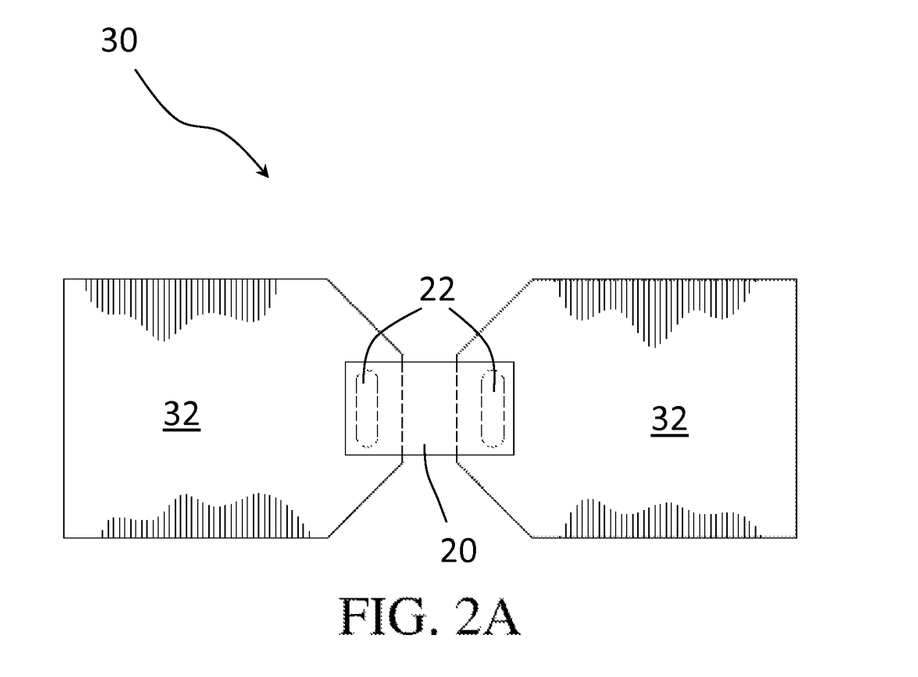
FIG. 2A shows a top view of an RFID chip mounted on an RFID strap.
Figure 2B:
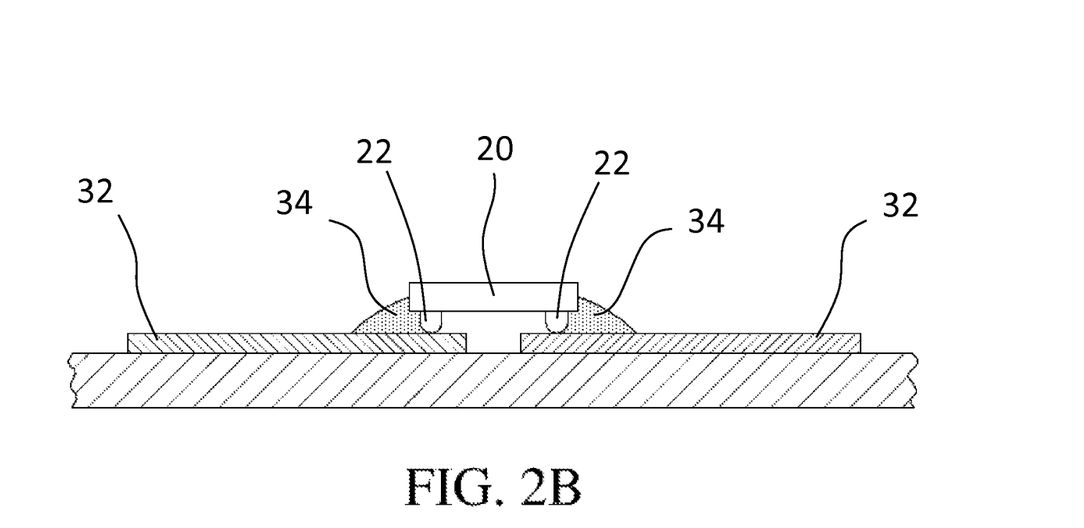
FIG. 2B shows a side view of an RFID chip mounted on an RFID strap.

Referring to exemplary FIGS. 2A and 2B, an RFID chip 20 may be mounted as part of an RFID strap 30. RFID strap 30 may also include contact pads 32. RFID chip 20 may be electrically coupled to contact pads 32 by way of connection points 22. Connection points 22 may include raised areas on a chip's surface. An adhesive 34 may be used to bind chip 20 to contact pads 32. Adhesive 34 may also contain electrically conductive particles which may assist with the formation of an electrical contact between RFID chip 20 and pads 32.

Figure 3:
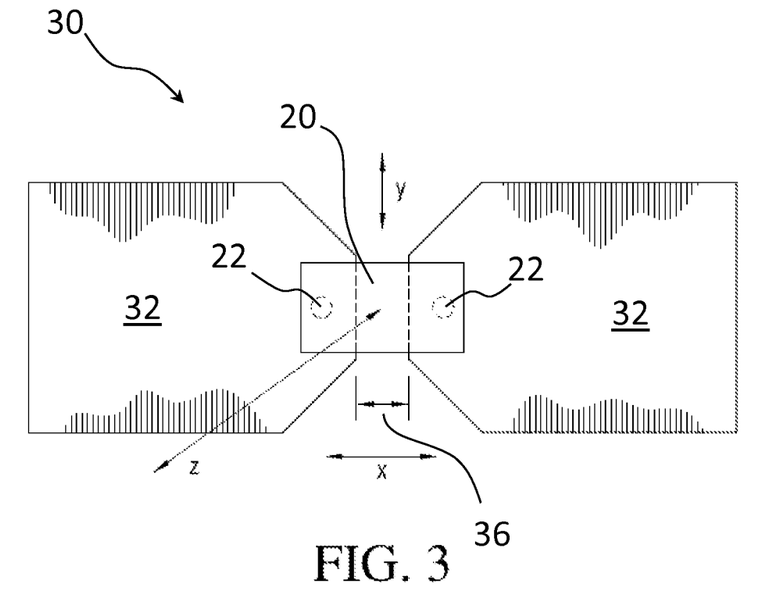
FIG. 3 shows an RFID strap with reference axes shown.

Exemplary FIG. 3 shows RFID strap 30 with RFID chip 20, connection points 22, and contact pads 32. The parasitic capacitance $C_P$ is a function of the size and shape of the overlap area between chip 20 and contact pads 32 and their relative positions, the size of gap 36 between contact pads 32, the dielectric constant of adhesive 34, and the separation between the surfaces of chip 20 and contact pads 32. These parameters are subject to the assembly process and can potentially vary from strap to strap. The capacitance of an RFID strap $C_S$, when joint resistance $R_J$ is negligible, is therefore defined by:

$$C_S = C_C + C_P$$

Figure 4:
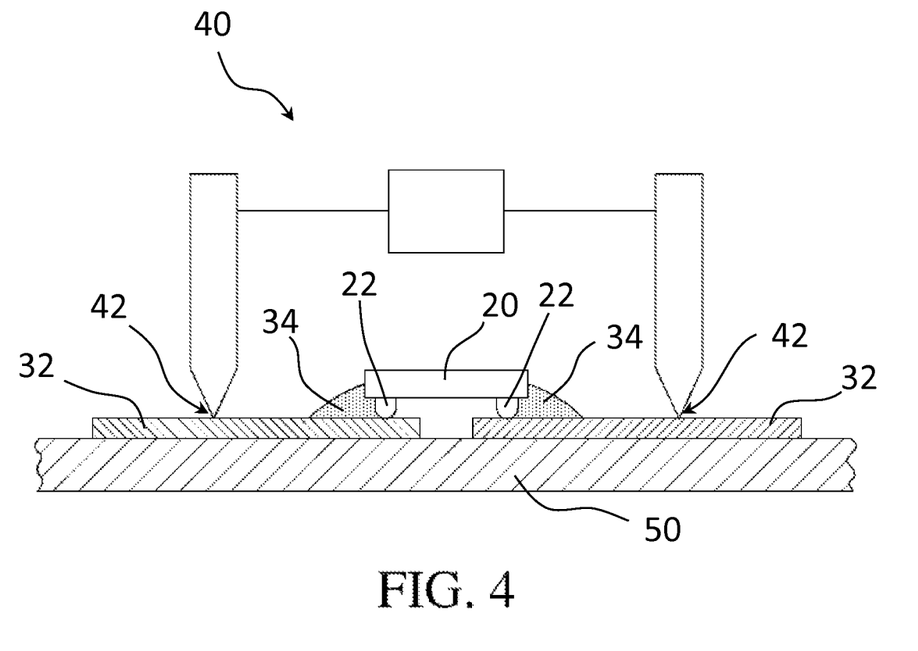
FIG. 4 shows a conventional method for measuring electrical properties of an RFID strap.

Referring to exemplary FIG. 4, a conventional measuring system 40 for measuring the capacitance and/or resistance of an RFID strap 30 may utilize contact points 42 with which to create an electrical contact with contact pads 32 of RFID strap 30. Exemplary FIG. 4 also shows that measuring can be done while strap 30 is mounted on a substrate 50. Substrate 50 may be for example, a web used in production, such as a conveyer belt, heat stabilized PET, paper, or as desired. In some exemplary embodiments, conventional measuring system 40 may be a vector network analyzer, impedance analyzer, or any other system capable of measuring a connection between chip 20 contact pads 32, or any other component such as an antenna (not shown), or as desired. All chip attach systems have some variability in these parameters, and they may have differing contributions to the overall $C_P$ and $R_P$.

Figure 5A:
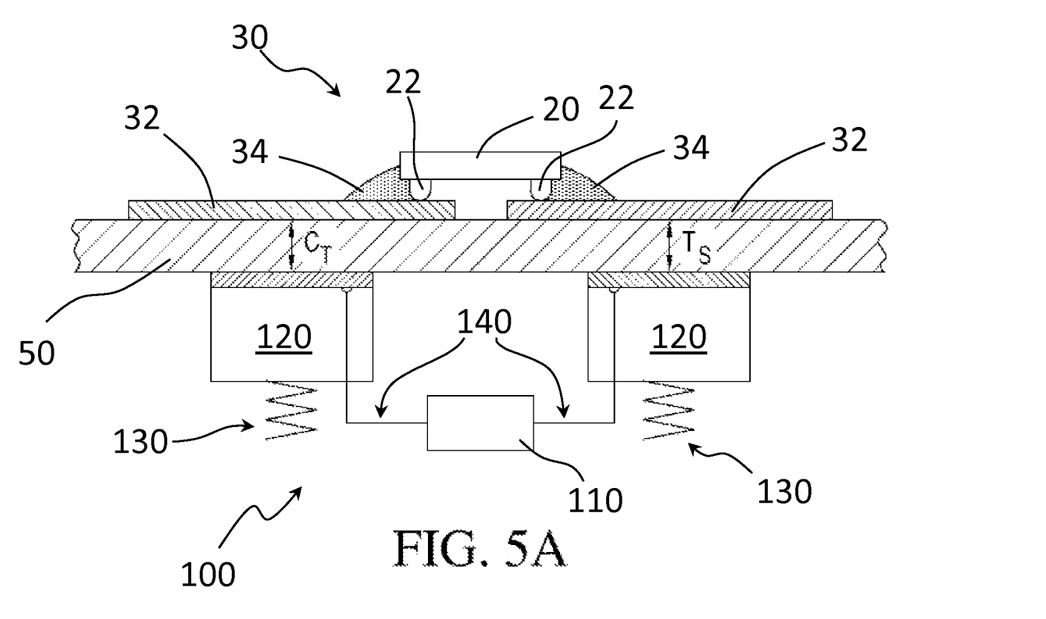
FIG. 5A shows a side view of a capacitive measuring system to measure electrical properties of an RFID strap.
Figure 5B:
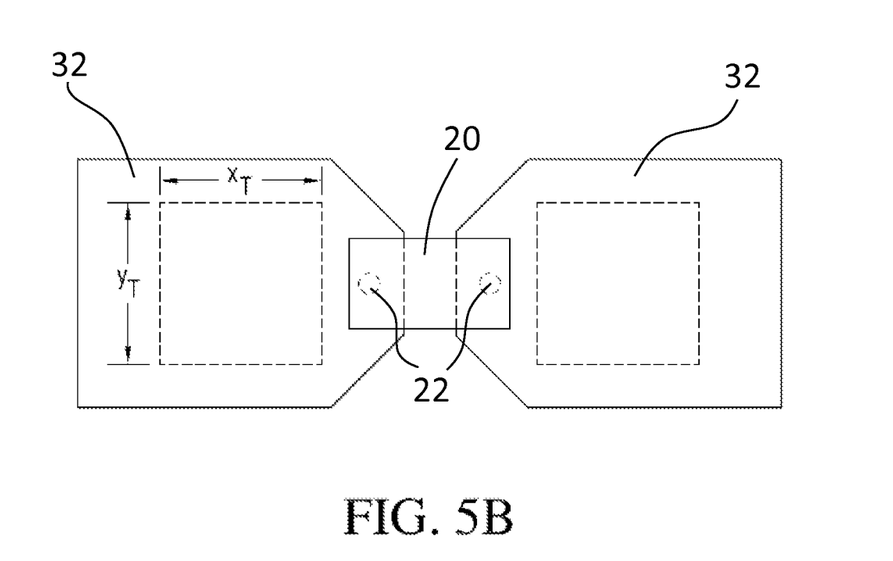
FIG. 5B shows a top view of a capacitive measuring system to measure electrical properties of an RFID strap.

Now referring to exemplary FIGS. 5A and 5B, a capacitive measuring system 100 may be used to measure the strap capacitance and/or resistance of an RFID strap 30 mounted on a substrate 50 and containing RFID chip 20. Measuring system 100 may include a meter 110, test pads 120, springs 130, and wiring 140, as desired, to communicatively couple the elements of system 100. Test pads 120 may contact substrate 50 opposite contact pads 32. Springs 130 may apply pressure to test pads 120, such that test pads 120 maintain contact with substrate 50. Meter 110 may be any known meter capable of measuring electrical capacitance and/or resistance. A coupling capacitance $C_T$ may be defined between RFID strap 30 and test pads 120. Coupling capacitance $C_T$ may be a function of the thickness of substrate 50, $T_S$, its relative dielectric constant, k, and the overlap area between strap 30 and pads 120, as defined by its x-y dimensions $x_T$ and $y_T$. Other capacitances may exist, such as a fringing capacitance, but for the purposes of the present example these may be considered as negligible compared to the intended capacitance or a constant. Additionally, though only an RFID strap is shown for clarity, measuring system 100 may be used to measure electrical properties of other RFID assemblies, for example an RFID chip mounted on an antenna.

Figure 6A:
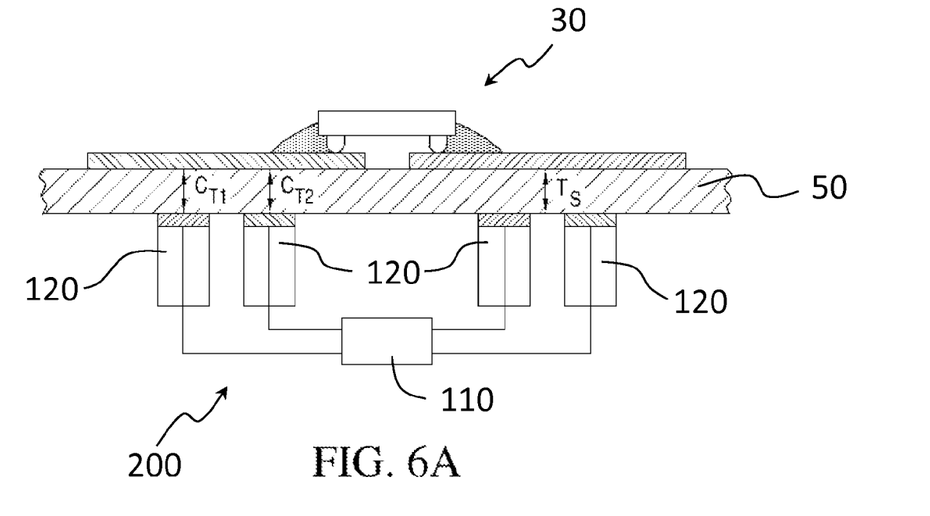
FIG. 6A shows a side view of a capacitive measuring system with a multi-point coupling scheme to measure electrical properties of an RFID strap.
Figure 6B:
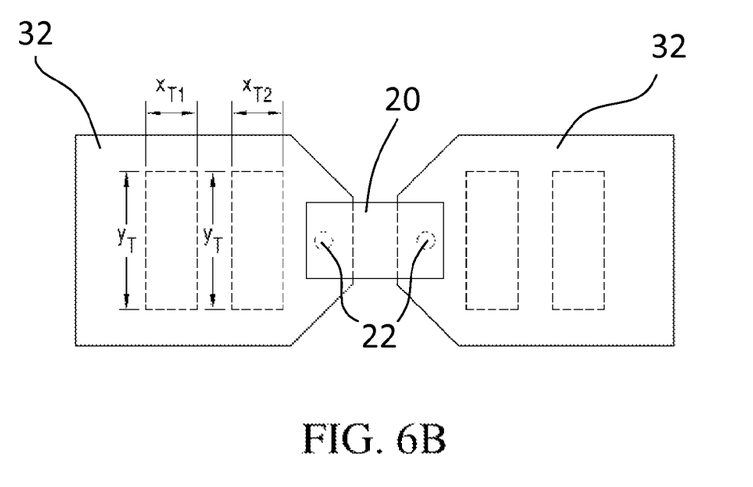
FIG. 6B shows a top view of a capacitive measuring system with a multi-point coupling scheme to measure electrical properties of an RFID strap.

In exemplary FIGS. 6A and 6B, a capacitive measuring system 200 may utilize a multi-point coupling scheme to allow compensation for characteristics of substrate 50. System 200 may include a meter 110 and any number of test pads 120. Meter 110 may be similar to the meter as shown in exemplary FIG. 5 and described above. In some exemplary embodiments, springs (not shown) may also be used to maintain contact between test pads 120 and substrate 50. The test pads 120 may define at least two coupling capacitances on each side of strap 30, $C_{T1}$ and $C_{T2}$ (each shown only on one side for clarity). Capacitances $C_{T1}$ and $C_{T2}$ are dependent on characteristics of substrate 50, including $T_S$ and k, as previously defined. Capacitances $C_{T1}$ and $C_{T2}$ may also be dependent on the overlap area of test pads 120 and strap 30, as defined by their respective x-y dimensions, in this example being $x_{T1}$ and $y_T$, and $x_{T2}$ and $y_T$. The multiple test pads 120 may allow for compensation for some or all of the variables associated with substrate 50. Compensation may include adjustments accounting for variations in substrate 50, such as changes in thickness or k.

Figure 7:
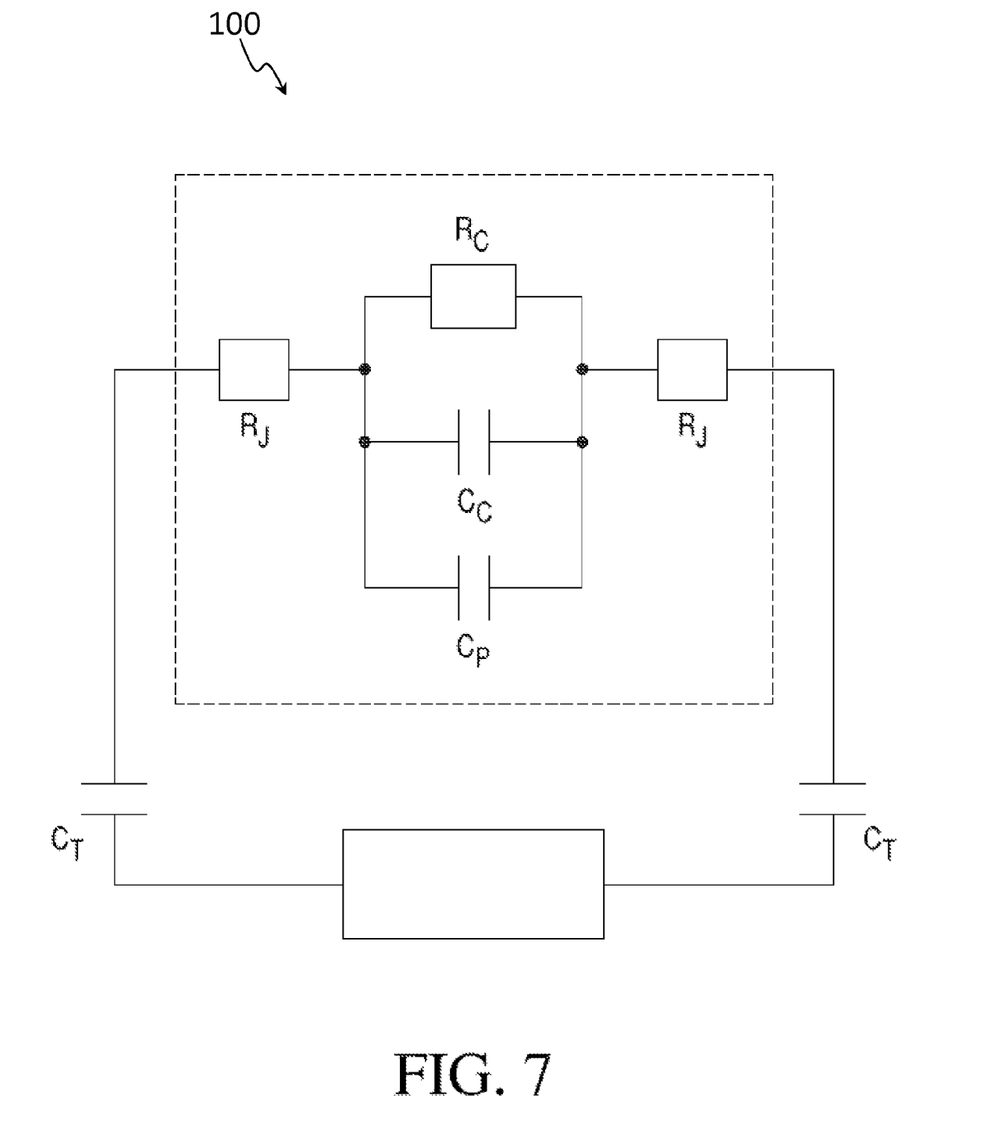
FIG. 7 shows a circuit diagram of a capacitive measuring system to measure electrical properties of an RFID strap.

Referring to exemplary FIG. 7, a circuit diagram of a capacitive measuring system 100 for a strap 30 may be provided. Assuming joint resistance $R_J$ is negligible, as discussed in reference to exemplary FIG. 1B, it may be shown that $C_T$ is a function of substrate dielectric constant k, thickness $T_S$, and coupling area A, which may be calculated from the pad dimensions. With the measured capacitance and the calculated coupling capacitance $C_T$, and assuming negligible joint resistance $R_J$, the strap capacitance $C_S$ can be calculated. As can be seen, strap capacitance $C_S$ is a function of chip capacitance $C_C$ and the parasitic capacitance $C_P$.

Figure 8:
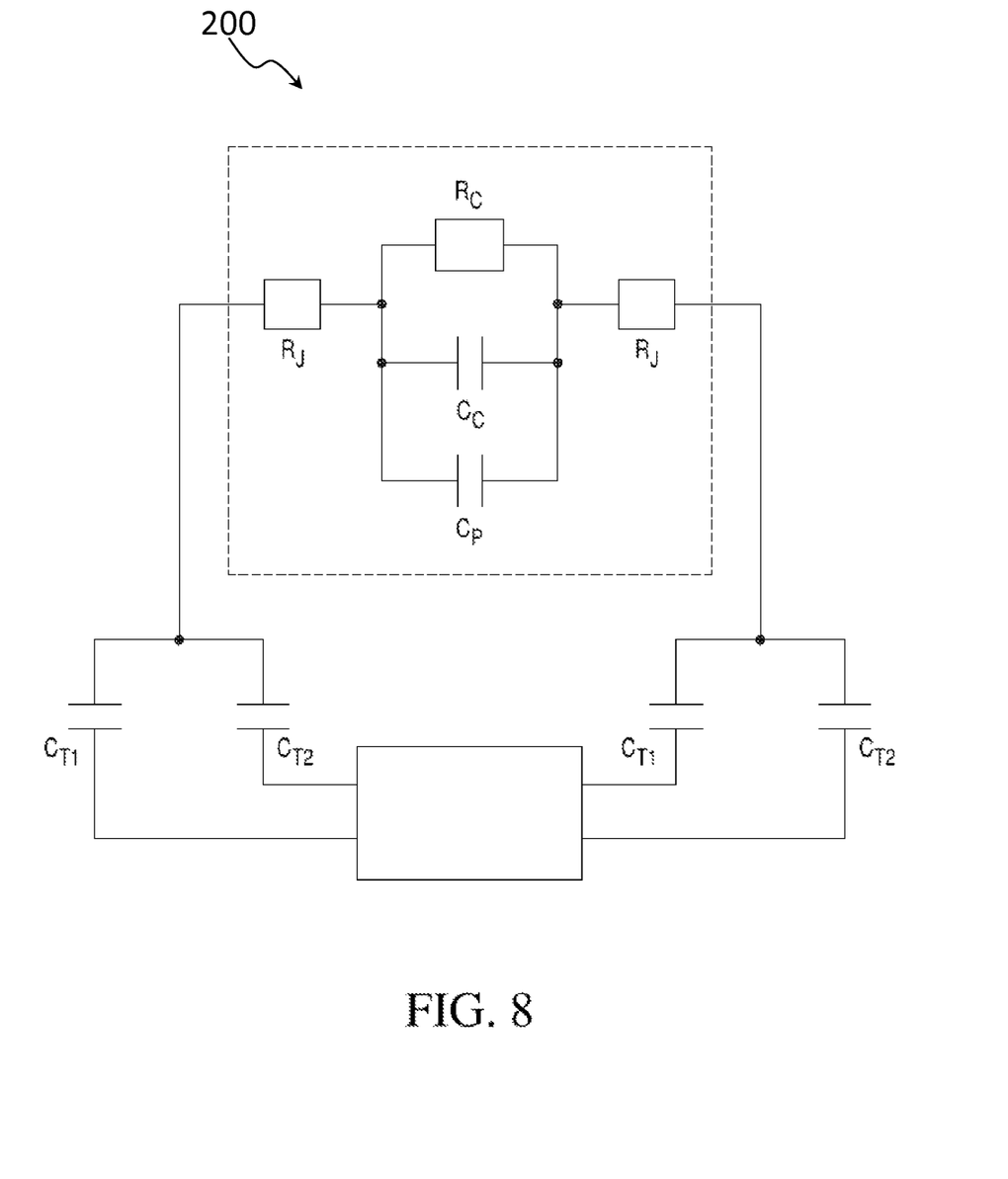
FIG. 8 shows a circuit diagram of a capacitive measuring system with a multi-point coupling scheme to measure electrical properties of an RFID strap.

Referring to exemplary FIG. 8, a circuit diagram of a capacitive measuring system 200 utilizing a multi-point coupling scheme may be provided. Assuming joint resistance $R_J$ is negligible, as discussed in reference to exemplary FIG. 1B, it may be shown that $C_{T1}$ and $C_{T2}$ are both a function of the substrate dielectric constant k, thickness $T_S$, and the coupling area A, which may be calculated from the pad dimensions. With the measured capacitance and the calculated coupling capacitances $C_{T1}$ and $C_{T2}$, and assuming negligible joint resistance $R_J$, the strap capacitance $C_S$ can be calculated. As can be seen, strap capacitance $C_S$ is a function of the chip capacitance $C_C$ and the parasitic capacitance $C_P$.

Figure 9:
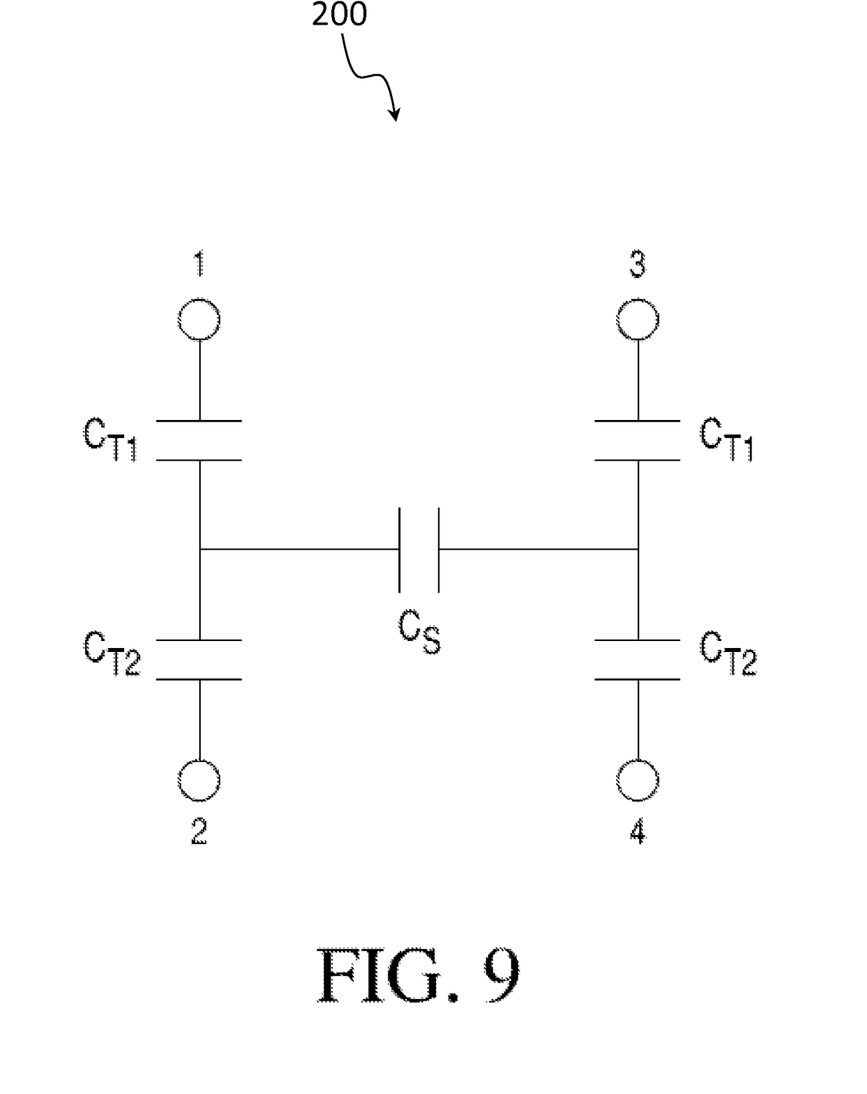
FIG. 9 shows a simplified circuit diagram of a capacitive measuring system with a multi-point coupling scheme to measure electrical properties of an RFID strap.

Now referring to exemplary FIG. 9, a simplified circuit diagram of capacitive measuring system 200 with measurement nodes 1, 2, 3, and 4 may help demonstrate how strap capacitance $C_S$ may be calculated directly without having to calculate $C_{T1}$ or $C_{T2}$ using k, $T_S$, or coupling area A. Measurement nodes 1-4 may be connected to a meter, for example meter 110 as shown in exemplary FIG. 6 and described above.

To calculate $C_S$, $C_{T1}$ may first be calculated. By measuring between node 1 and node 2, a total capacitance $C_{TOTAL}$ may be measured. $C_{TOTAL}$ conforms to the following equation:

$$\frac{1}{C_{TOTAL}} = \frac{1}{C_{T1}} + \frac{1}{C_{T2}}$$

Assuming $C_{T1} = C_{T2}$, $\frac{1}{C_{TOTAL}} = \frac{2}{C_{T1}}$ $$C_{TOTAL} = \frac{C_{T1}}{2}$$

$$C_{T1} = 2C_{TOTAL}$$

Having calculated $C_{T1}$, $C_S$ can be calculated by measuring between node 1 and node 3. The total measured capacitance $C_{TEST}$ conforms to the following equation:

$$\frac{1}{C_{TEST}} = \frac{1}{C_{T1}} + \frac{1}{C_{T1}} + \frac{1}{C_S}$$

$$\frac{1}{C_{TEST}} = \frac{2}{C_{T1}} + \frac{1}{C_S}$$

Because $C_{T1}$ was previously calculated, $C_S$ may now be calculated using the measured $C_{TEST}$ and the calculated $C_{T1}$. This diagram and series of measurements and calculations may serve as one example of how to find the value of a desired variable, in this case $C_S$. Other combinations of measurements and calculations to find the value of a particular desired variable are also possible.

If CT1 and CT2 are not equal, additional measurements can be carried out to resolve the values and hence Cs. For example, the series combination of CT1 and CT2 may be measured between nodes 1 and 2; the series combination of the two elements CT1 and CS may be measured between nodes 1 and 3; the series combination of the two elements CT2 and CS may be measured between nodes 2 and 4. Knowledge of this set of values allows the value of Cs to be determined.

Figure 10A:
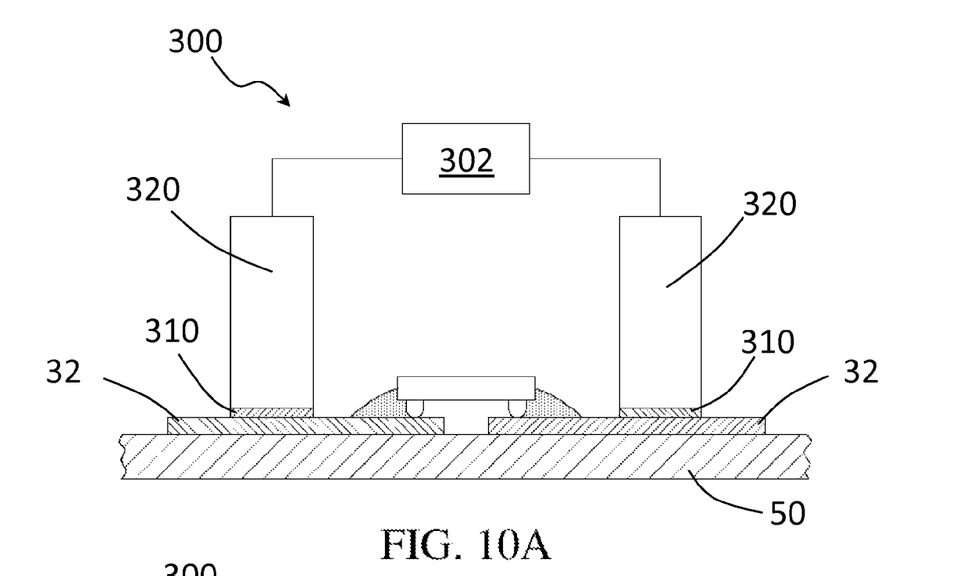
FIG. 10A shows an alternative embodiment of a capacitive measuring system to measure electrical properties of an RFID strap.
Figure 10B:
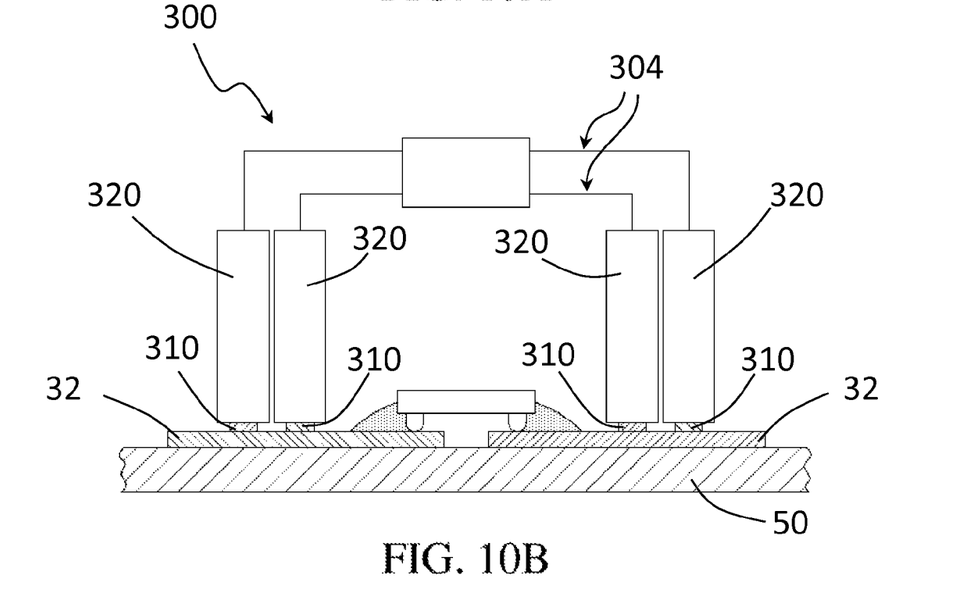
FIG. 10B shows an alternative embodiment of a capacitive measuring system with a multi-point coupling scheme to measure electrical properties of an RFID strap.

Exemplary FIGS. 10A and 10B may provide an alternative exemplary embodiment of a capacitive measuring system 300. In this embodiment, capacitive measuring system 300 may be configured such that the capacitive coupling is made onto the top metal surface of a strap 30 to determine strap capacitance $C_S$ using meter 302. The coupling may be made via dielectric separators 310. Meter 302 and dielectric separators 310 may be communicatively coupled via wiring 304 as desired. Dielectric separator 310 may be thin relative to substrate 50. Consequently, the coupling capacitance $C_T$ may be higher as compared to the strap capacitance $C_S$. This may allow variations in the thickness and dielectric constant of dielectric separator 310 to have less impact on the resulting measurements. The impact may become negligible when the combination yields a high $C_T$, depending on the desired accuracy. In an exemplary embodiment, the dielectric separator 310 may include a low friction plastic material, such as PTFE, or a material with a higher dielectric constant such as ceramic. The dielectric separator may include other materials as would be reasonably understood by a person having ordinary skill in the art. In some exemplary embodiments, dielectric separator 310 may be made by intentionally oxidizing the end of a conductive test post 320 to form a thin dielectric layer. Exemplary FIG. 10B may provide a multi-point version of system 300. The multiple contact points may allow compensation for $C_{T1}$ and $C_{T2}$ as previously described. Dielectric separator 310 may extend the full width of the end of conductive test post 320 as shown in exemplary FIG. 10A, or only part of the width as shown in exemplary FIG. 10B, or as desired.

Figure 11A:
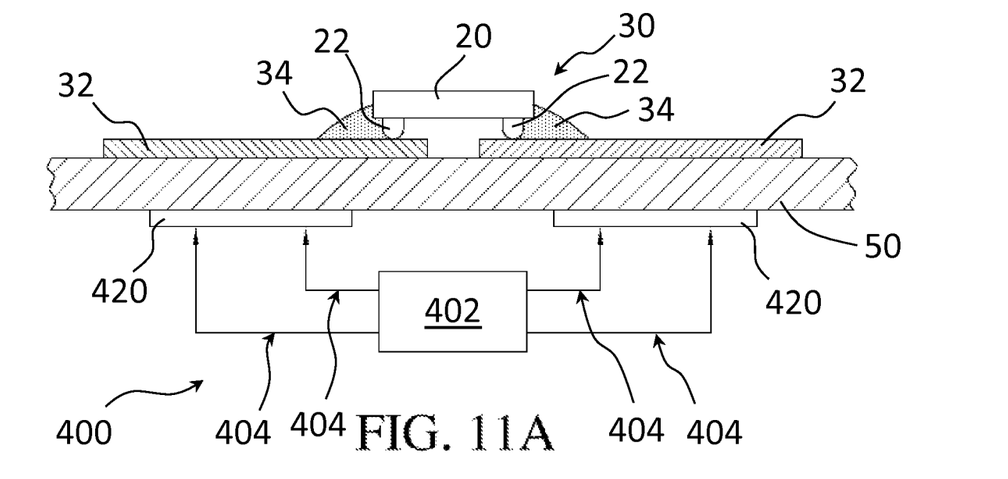
FIG. 11A shows side view of a system for determining the optimum placement of an RFID strap.
Figure 11B:
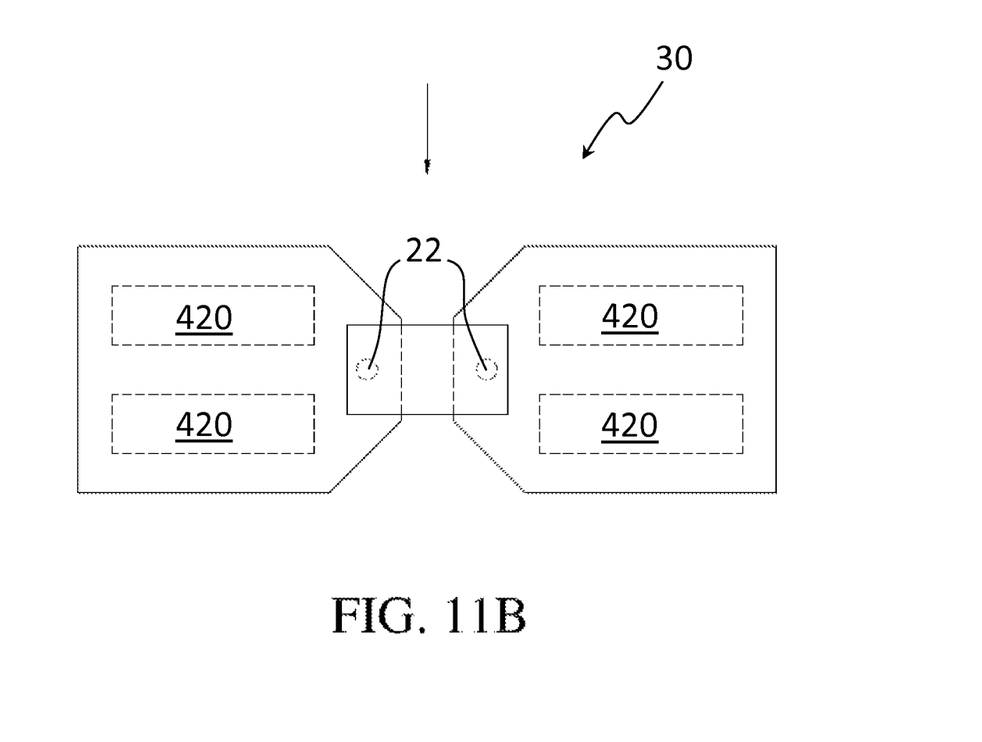
FIG. 11B shows top view of a system for determining the optimum placement of an RFID strap.

Exemplary FIGS. 11A and 11B may provide a system 400 for determining when a strap 30 is in an optimum or desired position for measurement, for example if strap 30 is moving across the aperture of test system 400 in a continuous manner. System 400 may be configured such that capacitive coupling is made between coupling points 420 and contact pads 32 of strap 30. Coupling points 420 may be communicatively coupled with meter 402 via wiring 404 as desired. System 400 may be used to monitor the value of the series combination of $C_{T1}$ and $C_{T2}$, for example as described generally in relation to exemplary FIG. 9 above. A maximum value of the tested capacitance may be reached when $C_{T1}=C_{T2}$. When $C_{T1}=C_{T2}$, the coupling pads associated with $C_{T1}$ and $C_{T2}$ may be arranged evenly on either side of the centerline of strap 30 in the x-direction, assuming the strap pads are symmetrical. Optical examination of chip positioning and strap structure accuracy, controlling the operation of a strap marking or chip crushing system either at the test position or an integer multiple of the strap separation after the test position, essentially acts as an high accuracy alternative to an optical or other position sensor.

As described above in relation to exemplary FIGS. 6A, 6B, 8, and 9, the use of multiple capacitive coupling points 420 may allow for compensation of errors that would occur due to the variation in thickness and dielectric constant of the intervening layer, which may thereby allow measurement accuracy in the order of 1% of the strap capacitance $C_S$ to be carried out with a non-contact method.

The foregoing description and accompanying figures illustrate the principles, preferred embodiments and modes of operation of the invention. However, the invention should not be construed as being limited to the particular embodiments discussed above. Additional variations of the embodiments discussed above will be appreciated by those skilled in the art.

Therefore, the above-described embodiments should be regarded as illustrative rather than restrictive. Accordingly, it should be appreciated that variations to those embodiments can be made by those skilled in the art without departing from the scope of the invention as defined by the following claims.

What is claimed is:

1. A system for measuring the capacitance of an RFID strap, comprising:
    an RFID strap comprising an RFID chip, a first contact pad, and at least a second contact pad coupled to the RFID chip;
    a substrate having a first and second side, wherein the first side and second side are opposite one another; and
    a measuring system comprising a meter, a first test pad, and a second test pad;
    wherein the meter and the first and second test pads are communicatively coupled,
    wherein the RFID strap is placed on the first side of the substrate such that first contact pad and the second contact pad are in contact with the first side of the substrate, the first test pad is placed on the second side of the substrate opposite the first contact pad such that there is an area of overlap through the substrate between the first test pad and the first contact pad, the second test pad is placed on the second side of the substrate opposite the second contact pad such that there is an area of overlap through the substrate between the second test pad and the second contact pad, and
    wherein the meter measures the total capacitance between the first test pad and the second test pad.

2. The system for measuring the capacitance of an RFID strap of claim 1, further comprising a first spring and a second spring, wherein the first spring applies a force to the first test pad against the second side of the substrate and the second spring applies a force to the second test pad against the second side of the substrate.

3. The system for measuring the capacitance of an RFID strap of claim 1, wherein the RFID strap further comprises an adhesive that assists in the coupling between each of the first and second contact pads and the RFID chip.

4. A system for measuring the capacitance of an RFID strap, comprising:
    an RFID strap comprising an RFID chip, a first contact pad coupled to the chip, and a second contact pad coupled to the chip;
    a substrate having a first and second side, wherein the first side and second side are opposite one another; and
    a measuring system comprising a meter and a plurality of test pads;
    wherein the meter and the plurality of test pads are communicatively coupled,
    wherein the RFID strap is placed on the first side of the substrate such that first contact pad and the second contact pad are in contact with the first side of the substrate, the plurality of test pads are placed on the second side of the substrate such that:
        at least two test pads are opposite the first contact pad such that there is an area of overlap through the substrate between the test pads and the first contact pad; and
        at least two test pads are opposite the second contact pad such that there is an area of overlap through the substrate between the test pads and the second contact pad, and
    wherein the meter is configured to measure the total capacitance between any two of the at least four test pads.

5. The system for measuring the capacitance of an RFID strap of claim 4, further comprising at least four springs, wherein each spring applies a force to one of the plurality of test pads against the second side of the substrate.

6. The system for measuring the capacitance of an RFID strap of claim 4, wherein the RFID strap further comprises an adhesive that assists in the coupling between each of the first and second contact pads and the RFID chip.

7. A system for measuring the capacitance of an RFID strap, comprising:
    an RFID strap with an RFID chip, a first contact pad coupled to the chip, and a second contact pad coupled to the chip; and
    a measuring system comprising a meter, a first conductive test post, a second conductive test post, a first separator located proximate to one end of the first conductive test post, and a second separator located proximate to one end of the second conductive test post;
    wherein the meter, the first and second conductive test posts, and the first and second separators are communicatively coupled by wiring,
    wherein the first separator is configured to be placed in contact with the first contact pad and the second separator is configured to be placed in contact with the second contact pad and wherein the meter is configured to measure the total capacitance between the first separator and the second separator.

8. The system for measuring the capacitance of an RFID strap of claim 7, further comprising a first spring and a second spring, wherein the first spring applies a force to the first separator, causing it to come in contact with the first contact pad and second spring applies a force to the second separator, causing it to come in contact with the second contact pad.

9. The system for measuring the capacitance of an RFID strap of claim 7, wherein the first separator extends to cover the full width of the end of the first conductive test post.

10. The system for measuring the capacitance of an RFID strap of claim 7, wherein the first separator does not extend to cover the full width of the end of the first conductive test post.

11. The system for measuring the capacitance of an RFID strap of claim 7, wherein the first separator further comprises polytetrafluoroethylene.

12. The system for measuring the capacitance of an RFID strap of claim 7, wherein the first separator further comprises ceramic.

13. The system for measuring the capacitance of an RFID strap of claim 7, wherein the first separator is formed by the oxidization of the end of the first conductive test post.

14. A system for measuring the capacitance of an RFID strap, comprising:
    an RFID strap comprising an RFID chip, a first contact pad, and a second contact pad, wherein the first and second contact pads are coupled to the RFID chip; and
    a measuring system comprising a meter, at least four conductive test posts, and at least four separators;
    wherein each of the at least four separators is located proximate to one end of each of the at least four conductive test posts,
    wherein the meter, the at least four conductive test posts, and the at least four separators are communicatively coupled via wiring,
    wherein the at least four separators are configured to be placed in contact with the RFID strap such that when in contact with the RFID strap:

at least two separators are in contact with the first contact pad; and at least two separators are in contact with the second contact pad, and wherein the meter is configured to measure the total capacitance between any two of the at least four separators.

15. A method for calculating the capacitance of an RFID strap, comprising:

assembling the system of claim 14;

measuring the capacitance between the at least two separators in contact with the first contact pad;

determining the coupling capacitance through a single separator;

measuring the capacitance between one of the at least two separators in contact with the first contact pad and one of the at least two separators in contact with the second contact pad;

calculating the capacitance of the RFID strap using the coupling capacitance of a single separator.

16. A method for calculating the capacitance of an RFID strap, comprising:

providing an RFID strap comprising an RFID chip, a first contact pad coupled to the chip, and a second contact pad coupled to the chip;

disposing the RFID strap on a substrate;

providing a measuring system having a meter communicatively coupled to a plurality of test pads;

orienting the measuring system such that the plurality of test pads are located on a side of the substrate opposite the first and second contact pads;

measuring the capacitance between the plurality of test pads opposite the first contact pad;

determining the coupling capacitance through the substrate for a single test pad;

measuring the capacitance between one of the plurality of test pads opposite the first contact pad and one of the plurality of test pads opposite the second contact pad;

calculating the capacitance of the RFID strap using the coupling capacitance of a single test pad.

* * * * *